United States Patent [19]

Oh et al.

[11] Patent Number: 5,455,454
[45] Date of Patent: Oct. 3, 1995

[54] SEMICONDUCTOR LEAD FRAME HAVING A DOWN SET SUPPORT MEMBER FORMED BY INWARDLY EXTENDING LEADS WITHIN A CENTRAL APERTURE

[75] Inventors: Seh H. Oh, Inchon-jikalshi; Do S. Jeung, Taegu-jikalshi, both of Rep. of Korea

[73] Assignee: Samsung Electronics Co., ltd., Rep. of Korea

[21] Appl. No.: 125,036

[22] Filed: Sep. 21, 1993

Related U.S. Application Data

[63] Continuation-in-part of Ser. No. 922,810, Jul. 30, 1992, abandoned.

[30] Foreign Application Priority Data

Mar. 28, 1992 [KR] Rep. of Korea .................. 92-5178

[51] Int. Cl.⁶ .................... H01L 23/48; H01L 29/62; H01L 29/44; H01L 29/52
[52] U.S. Cl. .................. 257/676; 257/666; 257/668
[58] Field of Search .............. 357/70, 68; 257/666, 257/667, 668, 669, 670, 671, 672, 673, 674, 675, 676

[56] References Cited

U.S. PATENT DOCUMENTS

| | | | |
|---|---|---|---|
| 4,218,701 | 8/1980 | Shirasaki | 257/670 |
| 4,899,207 | 2/1990 | Hallowell et al. | 257/676 |
| 4,942,452 | 7/1990 | Kitano et al. | 357/70 |
| 4,951,122 | 8/1990 | Tsubosaki et al. | 357/70 |
| 4,989,068 | 1/1991 | Yasuhara et al. | 357/70 |
| 5,006,919 | 4/1991 | Disko | 357/70 |
| 5,068,708 | 11/1991 | Newman | 357/70 |
| 5,140,404 | 8/1992 | Fogal et al. | 357/70 |
| 5,176,366 | 1/1993 | Masumoto et al. | 257/670 |
| 5,182,631 | 1/1993 | Tomimuro et al. | 257/670 |
| 5,294,827 | 3/1994 | McShane | 257/676 |
| 5,332,864 | 7/1994 | Liang et al. | 257/676 |
| 5,336,927 | 8/1994 | Suetake | 257/620 |

*Primary Examiner*—Sara W. Crane
*Assistant Examiner*—S. V. Clark
*Attorney, Agent, or Firm*—Ladas & Parry

[57] ABSTRACT

A semiconductor lead frame is disclosed. An adhesive tape is attached on one end part of inner leads and a bus bar, and a semiconductor chip is mounted on the adhesive tape without using a conventional die pad, wherein the inner leads is formed with a gap to be separated from neighboring leads by etching and the adhesive tape is supported by the bus bar so that the reliability of a semiconductor package is enhanced, and a labor for the development and production of the semiconductor package is saved because semiconductor chips of a variable size can be mounted on the same kind of the semiconductor package by changing only the adhesive tape without preparing another lead frame.

6 Claims, 5 Drawing Sheets

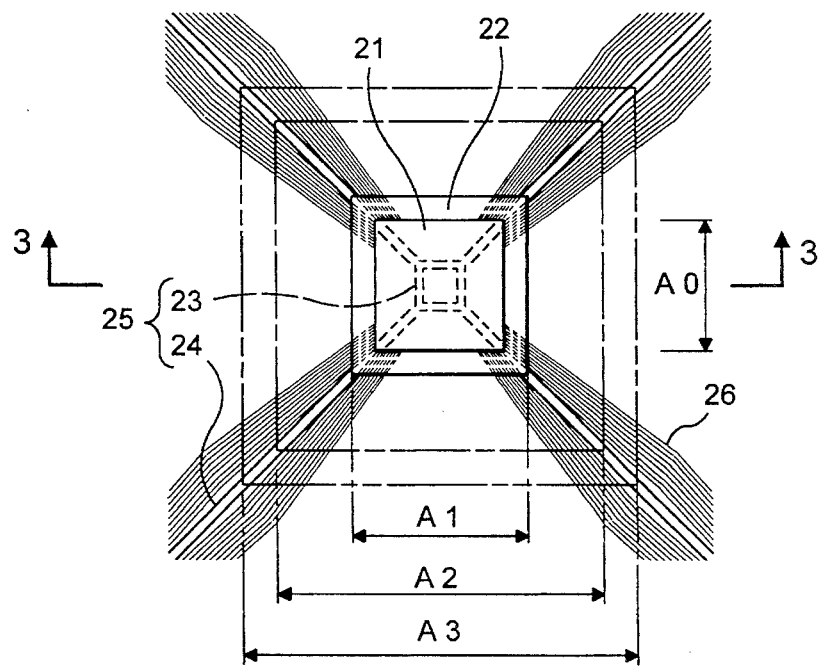
F I G. 2
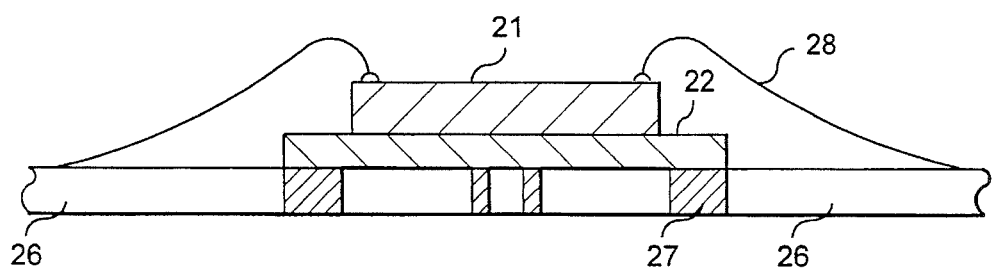
F I G. 3

SEMICONDUCTOR LEAD FRAME HAVING A DOWN SET SUPPORT MEMBER FORMED BY INWARDLY EXTENDING LEADS WITHIN A CENTRAL APERTURE

This is a continuation-in-part of application Ser. No. 07/922,810 filed on Jul. 30, 1992, now abandoned.

FIELD OF THE INVENTION

The present invention relate to a semiconductor lead frame, in which bus bars are formed instead of a conventional die pad and inner leads are extended, a semiconductor chip is amounted on the bus bar and the inner leads, so as to mount the semiconductor chip in a various size.

BACKGROUND OF THE INVENTION

The recent rapid developments in semiconductor industry have resulted in accelerating the increase of input and output terminals, the increase of signal processing speed and power consumption, and the requirement of high-density packaging. According to the high-integration of a semiconductor, a large amount of leads were required and a gap between leads was decreased, thereby making the design and assembling of a semiconductor lead frame more difficult. Moreover, as the increase of signal processing speed and power consumption caused the increase of heat generation, a heat sink was installed on a semiconductor package additionally, or a package material having a good heat conductivity was used to reduce the heat. Further, the COB (Chip On Board) method for directly mounting a chip on a printed circuit board or stacked packaging method have been used to meet the requirement of high-density packaging.

FIG. 1 is a top view of a conventional semiconductor lead frame. The semiconductor lead frame includes a semiconductor chip 11, a tetragonal die pad 12 for mounting the semiconductor chip 11, tie bars 13 provided at four edges of the die pad 12 for supporting the die pad 12, lots of inner leads 14 uniformly formed with a predetermined distance from the die pad 12, wires (not shown) for connecting a bonding pad formed on the semiconductor chip 11 to the inner leads 14, outer leads (not shown) for connecting the inner leads 14 to outside parts, and tapes 17 attached on the inner leads 14 to prevent the deformation of the inner leads 14.

In the above described conventional semiconductor lead frame, when semiconductor chips of a different size are mounted on a same kind of semiconductor package and if a chip size is smaller than die pad size, there occurs a sweeping, that is, the phenomenon that the wires are clustered together at one side during the molding process, or the phenomenon that the wires stick together. On the other hand, if a chip size is larger than a die pad size, a new semiconductor lead frame with a die pad of a proper size should be prepared.

Moreover, in the conventional semiconductor lead frame, the distance between the semiconductor chip and the inner leads in edge size is longer than that in lateral side, thereby the length of wires becoming different from each other at the time of bonding process. This increases the wire consumption during the production of a semicondutor package, resulting in the increase of a production cost and shortening a lifetime of a wire bonding apparatus.

SUMMARY OF THE INVENTION

The present invention overcomes these problems and provides a semiconductor lead frame in which semiconductor chips of a various size can be mounted on the same kind of a semiconductor package, thereby enhancing the reliability of a semiconductor package and reducing a labor for the development and production of a semiconductor package.

The present invention further provides a semiconductor lead frame in which the distance between the semiconductor chip and the inner leads is uniformly formed, resulting in a uniform wire length, thereby reducing a production cost and lengthening a lifetime of a wire bonding apparatus.

The semiconductor lead frame according to the present invention comprises an adhesive tape for mounting the semiconductor chip, a bus bar having a central part for supporting the adhesive tape and at least two or more supporting parts for supporting the central part, inner leads formed to be adjacent to the central part of the bus bar with a gap to be separated by etching between the leads and of which one end is attached to the lower surface of the adhesive tape, an insulating layer applied on one edges of the inner leads at the bus bar, and wires for connecting between the bonding pad formed on the semiconductor chip with the inner leads.

The objects and features of the present invention will become more apparent from a consideration of the following description which proceeds with reference to the accompanying drawings, in which selected example embodiment is illustrated by way of example, and not by way of limitation.

BRIEF DESCRIPTION OF THE DRAWINGS

FIG. 2 is a top view of a semiconductor lead frame according to the present invention, and FIG. 3 is a cross-sectional view along with a line A—A' of FIG. 2.

DETAILED DESCRIPTION OF THE PREFERRED EMBODIMENT

Figure 1:
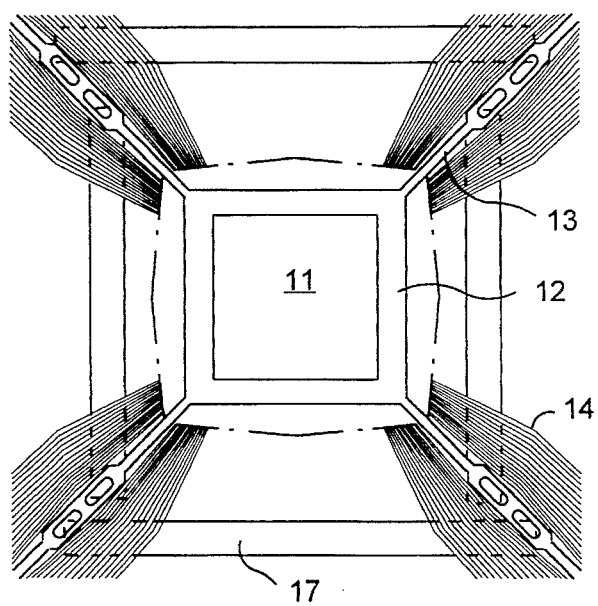
FIG. 1 is a top view of a conventional semiconductor lead frame.

Now, a semiconductor lead frame according to the present invention will be described in detail below with reference to the appended drawings.

FIG. 2 is a top view of a semiconductor lead frame according to the present invention, and FIG. 3 is a cross-sectional view along with a line A—A' of FIG. 2, in which the same reference number are made for the same part.

As shown in FIG. 2, a semiconductor chip 21 with a predetermined circuit is mounted on a tetragonal adhesive tape 22 by means of an adhesive such as epoxy using a known method. The adhesive tape 22 is made of an insulating material such as a polyimide and has an adhesive characteristic on the lower surface thereof or an adhesive characteristic on both surfaces without use of an epoxy.

The size of the tape 22 is decided according to that of the semiconductor chip 21 and is generally slightly larger than the semiconductor chip 21 to permit the spread of an adhesive at the time of mounting of the semiconductor chip 21. The tape 22 can be preferably formed in a circular form.

A bus bar 25 is attached under the adhesive tape 22 and comprises a central part 23 in the tetragonal form having an empty portion at the center and supporting parts 24 formed at four corner sides to fix the central part, the adhesive tape 22 being mounted with the semiconductor chip 21 to support the adhesive tape 22. The central part 23 of the bus bar 25 can be formed in a random shape, for example, a circle, triangle or tetragon with an uniform distances away from the inner leads 26 so as to form a cavity of about A0 size as shown in FIG. 2.

The inner leads 26 are formed with uniform gaps capable of separating by etching between the leads to approach most nearly to around the central part 23. An insulating layer 27 applied by an insulating material such as a polyimide is formed at the end part of the inner leads 26 toward the central part 23. The insulating layer 27 prevents the inner leads 26 formed adjacent to the central part within the range capable of etching from the deformation and contacting together during the packaging process. The inner leads is applied by a conductive material such as Ag within about A3 range for easily performing the wire bonding process.

Further, the one end part of the inner leads 26 applied by the insulating layer 27 and the bus bar 25 is attached under the adhesive tape 22 and prevent the deformation of the adhesive tape 22. That is, the bus bar 25 and the one end part of the inner leads 26 perform a role of a die pad of a conventional semiconductor lead frame. Bonding pad formed on the semiconductor chip and the inner leads 25 are connected by wires 28 having an uniform length irrespective of parts of the semiconductor chip 21.

The semiconductor chip 21 is mounted on the bus bar 25 and the end parts of the inner leads 26 by the adhesive tape 22. Accordingly, the size of the adhesive tape 22 should be A1 at the minimum to A2 at the maximum in a lateral length as shown in FIG. 2. Therefore, this semiconductor lead frame can be mounted with a various size of semiconductor chips within a lateral length A2. Further, if necessary for the wire bonding process and packaging process, the semiconductor chip 21 can be mounted by giving a down set to the central part of the bus bar 23 and the end part of the inner leads 26.

By way of additional description, it is explained that the "bus bar" (FIG. 4) is designated by the numeral 25 and includes, as portions thereof, inwardly extending rods 24 terminating in an apertured member 23. The rods 24 extend inwardly from the corners of a square frame formed by side bars 30.

Also extending inwardly from the side bars 30 are a plurality of leads 26. The inner ends of the leads 26 are connected together (see, also, FIG. 3) by a rigid frame 27 formed of an insulating material. In the fabrication of the lead frame, the various metal parts can be formed by etching a metal plate and, as formed, the various leads 26 comprise cantilevered beams supported intermediate the ends thereof by the frame 30. At this time, the inner ends of the leads are not connected together. The outer ends (FIG. 2), which extend beyond the frame 30 (FIG. 4), are also not connected together. Then, a narrow strip of insulating material is deposited on and between the inner ends of the leads 26. As previously noted, the insulating material can be a polyamide and is dispensed, e.g., from a syringe-like container as a viscous fluid. Upon hardening, the rigid frame 27 is formed. The frame 27 holds the narrow lead ends in fixed position and adds strength to the structure.

Also, as indicated in FIGS. 4–7, the inner ends of the leads 26 are coated with silver outwardly towards but not reaching the frame sides 30. The ends of the silver coated areas are shown by short lines and, as shown, the short lines outline a square area having 13 mm length sides. The dimensions provided herein are by way of example only.

Figure 4:
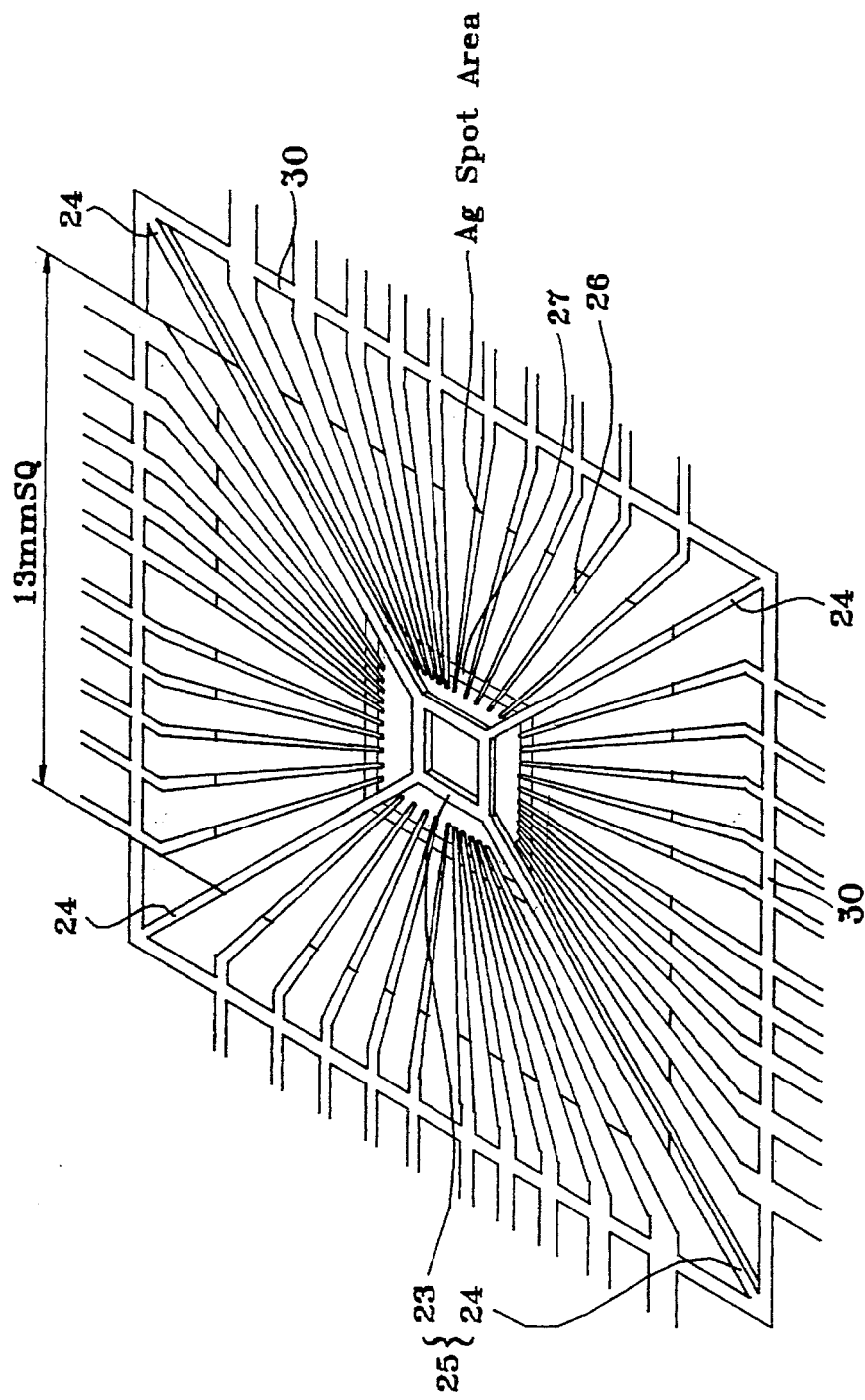
FIG. 4 is a perspective view of a lead frame prior to the addition thereto of an adhesive tape and a semiconductor chip.
Figure 5:
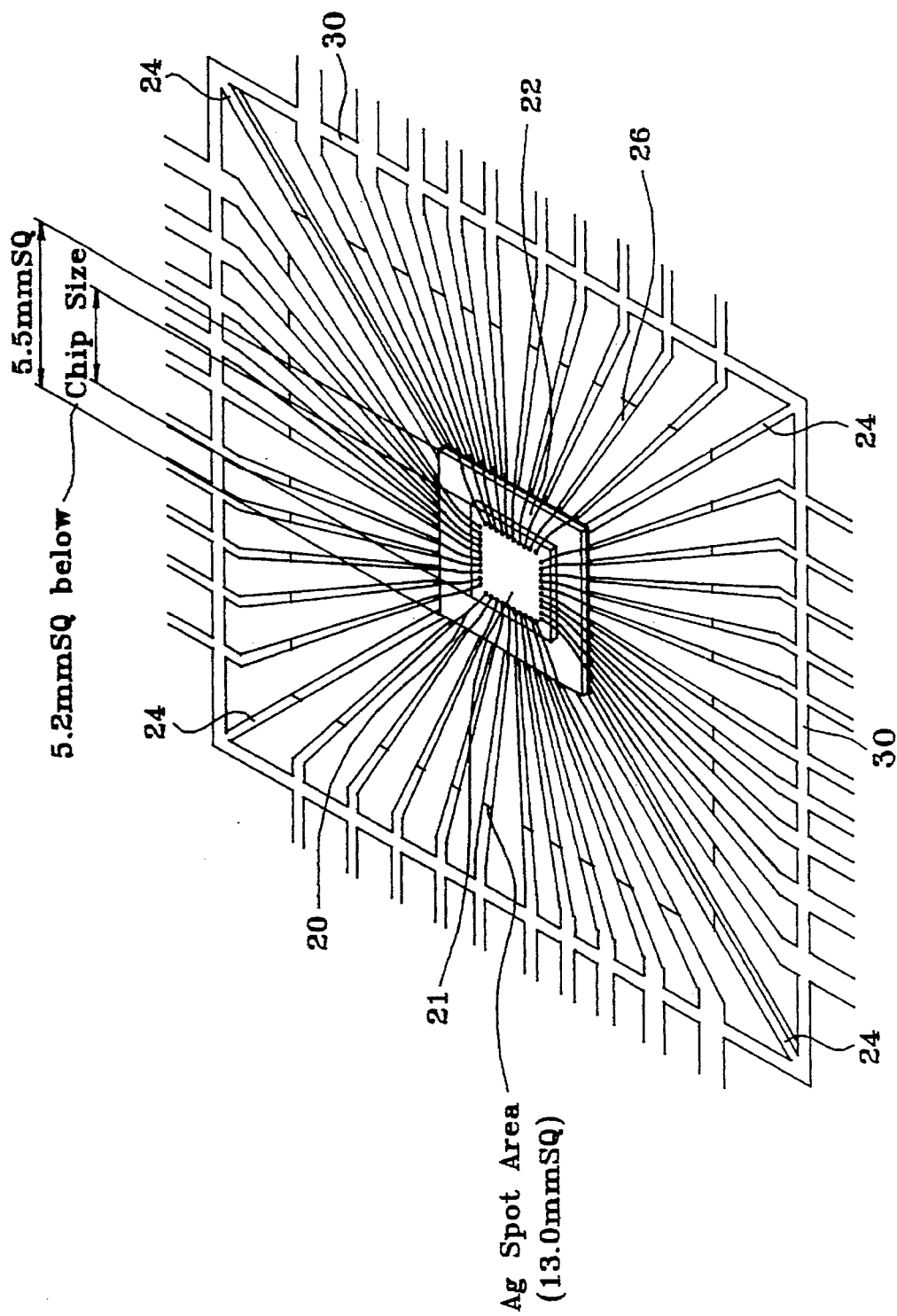
FIGS. 5–7 are perspective views showing the lead frame of FIG. 4 having mounted thereon different size tapes and chips.
Figure 6:
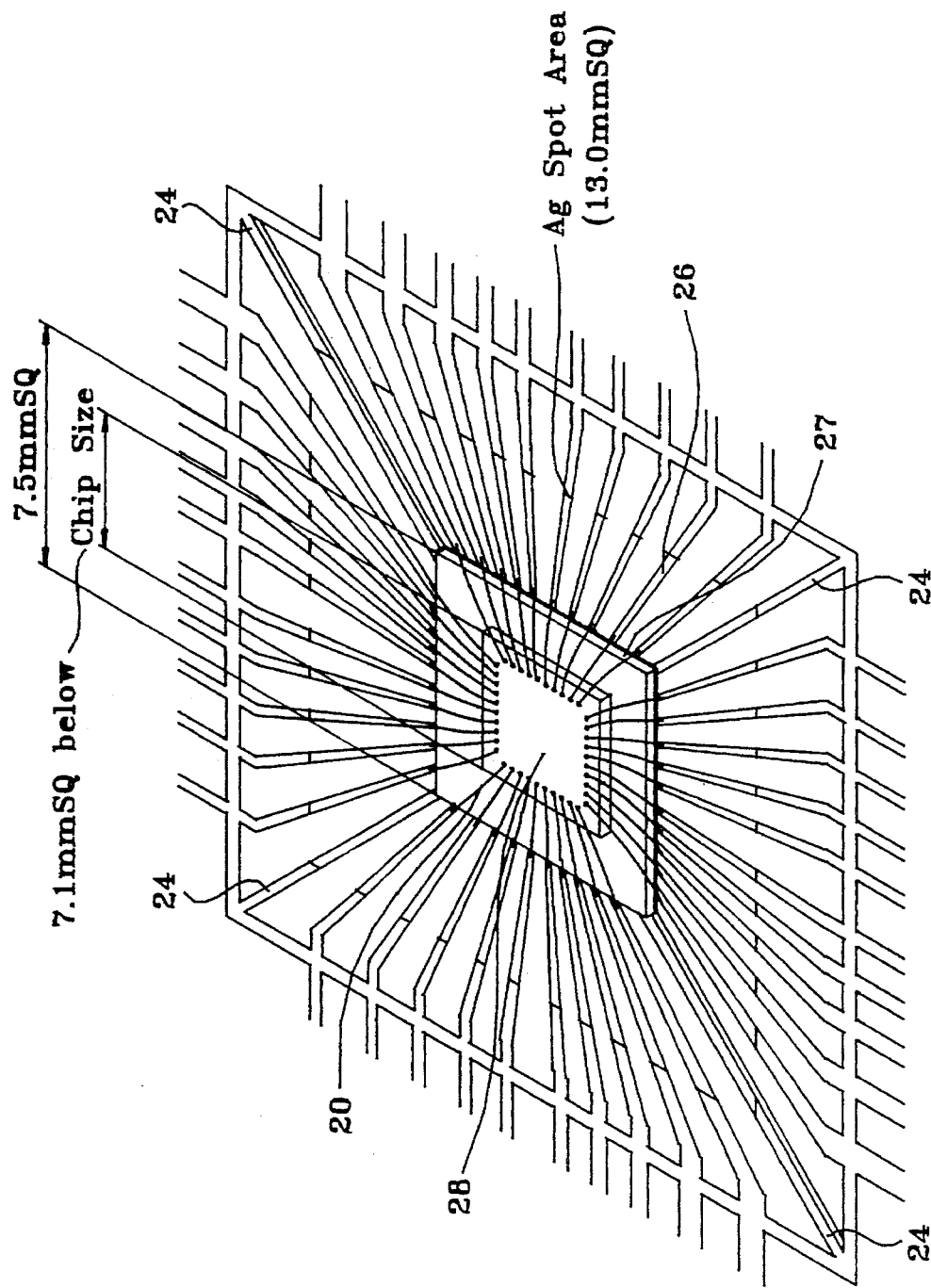
Figure 7:
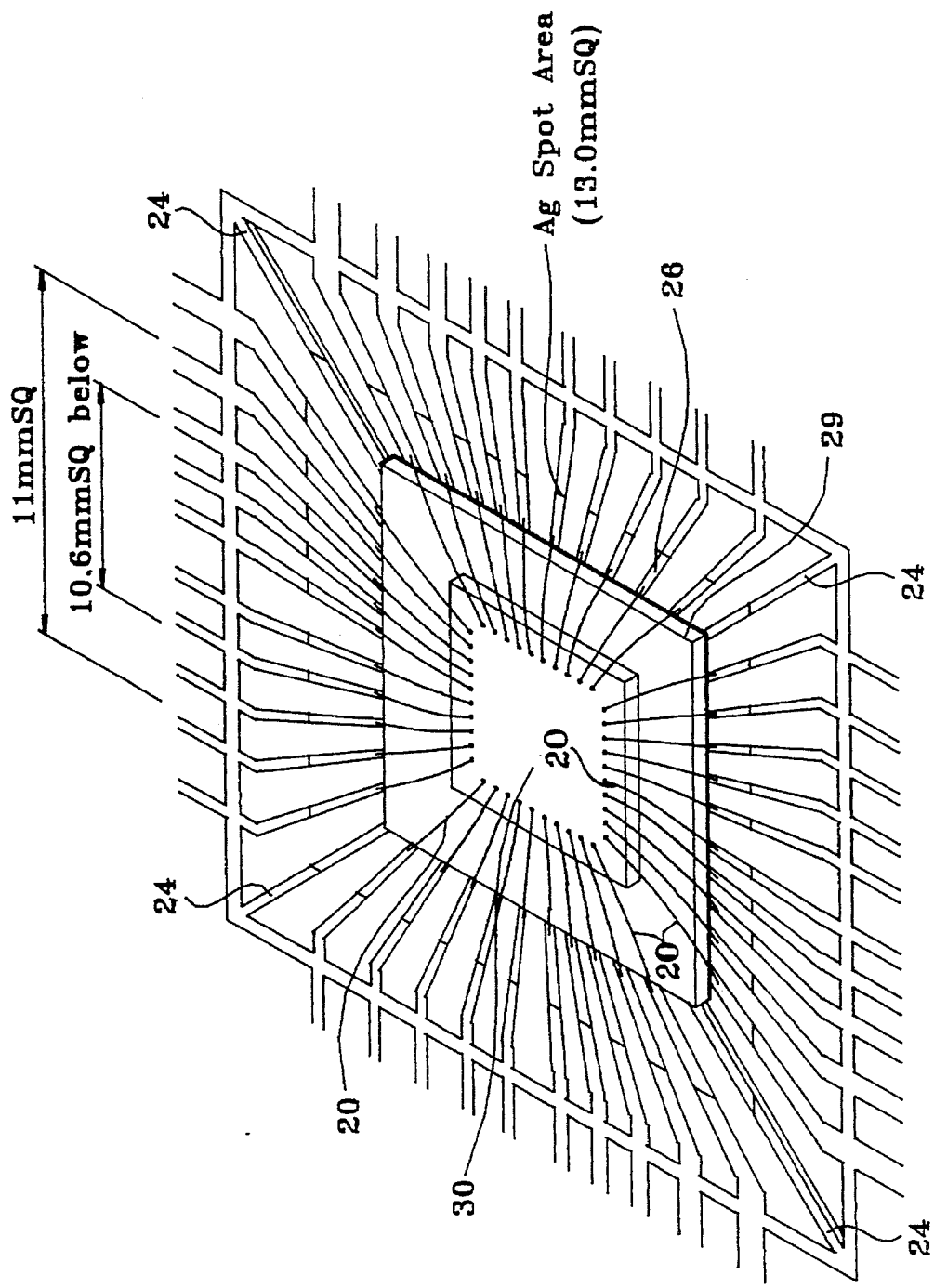

FIGS. 5–7 show the mounting of different size chips on the lead frame shown in FIG. 4.

Thus, in FIG. 5, the chip 21 is a square having 5.2 mm sides. For mounting the chip 21 on the lead frame, an adhesive tape 22, e.g., of square shape having 5.5 mm length sides, is mounted on the central portion 23 (FIG. 4) of the bus bar 25 and, because of its size, extends over, and is bonded to, the insulating material frame 27 and the adjacent inner ends of the leads 26. The tape 22 is of an insulating material, hence does not short together the various leads.

The tape 22, firmly mounted on the central portion of the lead frame, provides a firm platform for the chip 21 which is thereafter mounted centrally on the tape 22.

As previously noted, the tape can be provided with adhesive surfaces for adhering the tape to the lead frame and for adhering the chip to the tape.

Then, in known fashion, bonding wires 20 (corresponding to the wires 28 shown in FIG. 3) are bonded between various surface areas of the chip and respective leads 26.

Note that in each embodiment shown in FIGS. 5–7, the bonding wires are connected to the leads 26 closely adjacent to the edges of the tape 22. Thus, in each embodiment, the wires basically span the distance between the edges of the chip and the edges of the tape. To the extent that this distance is kept small, the wire lengths are small and the amount of expensive wires used is reduced in comparison with the prior art devices.

Also, as is apparent from a comparison of FIGS. 5–7, different size chips are easily accommodated on identical lead frames all of identical dimensions.

As described above, the present invention gives the advantages that the reliability of a semiconductor package is enhanced, and a labor for the development and production of a semiconductor package is saved because semiconductor chips of a various size can be mounted on the same kind of a semiconductor package by changing only a adhesive tape without preparing another lead frame.

Further, the present invention endows the advantages that the production cost is reduced, and the lifetime of a wire bonding apparatus is extended because the length of wires connecting between the semiconductor chip and the inner leads is uniformly formed.

The present invention is in not limited to the embodiment described hereinabove. Various modifications of disclosed embodiment of the present invention will become apparent to persons skilled in the art upon reference to the description of the present invention. Therefore, the appended claims will cover any such modifications or embodiments as fall within the true scope of the present invention.

What is claimed is:

1. A semiconductor lead frame having a central aperture defined by aperture sides, a first plurality of leads extending away from said aperture sides and having aperture facing ends, said ends being joined together by an insulating material whereby said joined together lead ends comprise said aperture sides, a second plurality of said leads extending inwardly of said sides and being connected together within said aperture to form an integral support member, said support member being provided with a down set relative to said aperture sides, and a member of insulating material overlying said aperture and being secured to said sides and to said support member.

2. A lead frame according to claim 1 wherein said aperture sides are continuous, and all of said first plurality of lead ends terminate at said sides.

3. A lead frame according to claim 1 and further including a semiconductor chip mounted on said insulating member, and bonding wires interconnecting surface portions of said chip with respective ones of said first plurality of leads, each of said bonding wires extending, in spaced apart relation, over a respective aperture side and into contact with its respective lead at a position spaced from the end of said respective lead.

4. A lead frame according to claim 1 wherein said support member has a shape selected from a group of shapes consisting of circles and polygons.

5. A lead frame according to claim 1 wherein said insulating material member has a shape selected from a group of shapes consisting of circles and polygons.

6. A lead frame according to claim 1, wherein said aperture sides are continuous, and said first plurality of lead ends extend inwardly of said aperture from said aperture sides.

* * * * *